United States Patent
Ikeda et al.

(10) Patent No.: US 12,422,500 B2
(45) Date of Patent: Sep. 23, 2025

(54) METHOD FOR INSPECTING A POWER STORAGE DEVICE, METHOD FOR MANUFACTURING A POWER STORAGE DEVICE, AND METHOD FOR MANUFACTURING A DEVICE STACK

(71) Applicants: Prime Planet Energy & Solutions, Inc., Tokyo (JP); TOYOTA JIDOSHA KABUSHIKI KAISHA, Aichi-ken (JP); PRIMEARTH EV ENERGY CO., LTD., Shizuoka-ken (JP)

(72) Inventors: Hiroaki Ikeda, Toyota (JP); Shusaku Goto, Hamamatsu (JP)

(73) Assignees: PRIME PLANET ENERGY & SOLUTIONS, INC., Tokyo (JP); TOYOTA JIDOSHA KABUSHIKI KAISHA, Aichi-ken (JP); TOYOTA BATTERY CO., LTD., Shizuoka-ken (JP)

(*) Notice: Subject to any disclaimer, the term of this patent is extended or adjusted under 35 U.S.C. 154(b) by 235 days.

(21) Appl. No.: 18/460,590

(22) Filed: Sep. 4, 2023

(65) Prior Publication Data

US 2024/0103096 A1    Mar. 28, 2024

(30) Foreign Application Priority Data

Sep. 22, 2022   (JP) .................. 2022-150808

(51) Int. Cl.
    *G01R 31/52*    (2020.01)
    *G01R 31/3835*  (2019.01)
    *H01M 10/44*   (2006.01)

(52) U.S. Cl.
    CPC ......... *G01R 31/52* (2020.01); *G01R 31/3835* (2019.01); *H01M 10/44* (2013.01)

(58) Field of Classification Search
    CPC .... G01R 31/52; G01R 31/389; G01R 31/396; G01R 31/3835; G01R 27/025; H01M 10/44
    (Continued)

(56) References Cited

U.S. PATENT DOCUMENTS

2010/0308834 A1  12/2010  Kawai et al.
2016/0291093 A1  10/2016  Matsuyama et al.
(Continued)

FOREIGN PATENT DOCUMENTS

JP    2009-070778 A    4/2009
JP    2014-026732 A    2/2014
(Continued)

*Primary Examiner* — Giovanni Astacio-Oquendo
*Assistant Examiner* — Trung Q Nguyen
(74) *Attorney, Agent, or Firm* — HAUPTMAN HAM, LLP

(57) ABSTRACT

A method for inspecting a battery in which an electrode body is accommodated in a case so that the electrode body is insulated from the case by an insulation film includes: adjusting the battery to a first voltage; measuring a first potential difference which is a potential difference between the case and a negative terminal that is exposed outside the case and electrically connected to a negative electrode plate to have a negative-electrode potential; measuring a second potential difference which is a potential difference between the case and the negative electrode plate after a lapse of a standby period of 24 hours or more; and determining whether or not a short circuit exists between the case and the negative electrode plate based on magnitude of the first and second potential differences and a change between the first potential difference and the second potential difference.

7 Claims, 8 Drawing Sheets

(58) Field of Classification Search
USPC .............. 324/500, 600, 76.11, 551, 425–434
See application file for complete search history.

(56) References Cited

U.S. PATENT DOCUMENTS

| | | | |
|---|---|---|---|
| 2019/0011502 A1 | 1/2019 | Kobayashi et al. | |
| 2019/0162771 A1* | 5/2019 | Miyazawa | H02J 7/0069 |
| 2020/0379050 A1* | 12/2020 | Imanaka | G01R 31/007 |
| 2023/0198035 A1* | 6/2023 | Takahashi | H02J 7/0047 |
| | | | 702/63 |

FOREIGN PATENT DOCUMENTS

| | | |
|---|---|---|
| JP | 2016-081712 A | 5/2016 |
| JP | 2016-192278 A | 11/2016 |
| JP | 2016-225167 A | 12/2016 |
| JP | 2019-016558 A | 1/2019 |
| JP | 2020072059 A | 5/2020 |

\* cited by examiner

METHOD FOR INSPECTING A POWER STORAGE DEVICE, METHOD FOR MANUFACTURING A POWER STORAGE DEVICE, AND METHOD FOR MANUFACTURING A DEVICE STACK

CROSS-REFERENCE TO RELATED APPLICATIONS

This application is based upon and claims the benefit of priority to Japanese Patent Application No. 2022-150808 filed on Sep. 22, 2022, the entire contents of which are incorporated herein by reference.

BACKGROUND

Technical Field

The present disclosure relates to a method for inspecting a power storage device, a method for manufacturing a power storage device, and a method for manufacturing a device stack.

Related Art

In manufacturing a power storage device such as a secondary battery, the power storage device may be inspected for whether or not a minute short circuit has been generated between a metal case of the power storage device and a negative electrode plate or sheet of an electrode body (e.g., see Japanese unexamined patent application publication No. 2020-072059). This is because the power storage device having a minute short circuit between the metal case and the negative electrode plate may cause a significant drop in capacity during long-term use, which may lead to quality deterioration.

SUMMARY

Technical Problems

The method for determining whether or not a minute short circuit exists between the metal case and the negative electrode plate may be performed by measuring a potential difference generated between the metal case and the negative electrode plate, which will be hereinafter referred to as a case-to-negative electrode potential difference. This is because the metal case and the negative electrode plate have almost the same potential if they are short-circuited. Specifically, a voltmeter (e.g., a digital multimeter) having sufficiently high internal resistance (e.g., 1 MΩ or higher) is connected to the metal case and a negative terminal that is electrically connected to the negative electrode plate and exposed outside the metal case, and a case-to-negative electrode potential difference is measured. When this measured case-to-negative electrode potential difference is equal to a threshold value or less, concretely, for example, 0.4 V or lower, it is determined that a minute short circuit has been generated between the metal case and the negative electrode plate.

However, in the aforementioned power storage device, the metal case and the electrode body (its negative electrode plate and positive electrode plate) are insulated by an insulation film or the like. Thus, the potential of the metal case is not fixed with respect to the negative-electrode potential of the negative electrode plate and the positive-electrode potential of the positive electrode plate, and thus is a floating potential. Therefore, when the case-to-negative electrode potential difference is measured in the above manner, if no short circuit exists between the metal case and the negative electrode plate, the obtained case-to-negative electrode potential difference is likely to fluctuate, which may become an extremely small value and even below a threshold value (e.g., 0.4 V or less). In other words, even though the metal case and the negative electrode plate are not short-circuited actually, there could be a case where they are erroneously judged to have a minute short circuit therebetween.

The present disclosure has been made to address the above problems and has a purpose to provide a method for inspecting a power storage device to appropriately determine whether or not a short circuit exists between a metal case and a negative electrode plate, a method for manufacturing a power storage device using this inspecting method, and a method for manufacturing a device stack using this inspecting method.

Means of Solving the Problems (1) To achieve the above-mentioned purpose, one aspect of the present disclosure provides a method for inspecting a power storage device comprising a metal case, an electrode body including a positive electrode plate and a negative electrode plate located outside the positive electrode plate in a thickness direction of the positive electrode plate, and an insulation film covering the electrode body to insulate the electrode body from the metal case, the method comprising: adjusting the power storage device to a first device voltage by charging or discharging the power storage device; measuring a first potential difference at a first potential difference measuring time after adjusting the power storage device to the first device voltage, the first potential difference being a case-to-negative electrode potential difference generated between the metal case and a negative-electrode potential member that is exposed outside the metal case and is electrically connected to the negative electrode plate to have a negative-electrode potential; measuring a second potential difference, which is the case-to-negative electrode potential difference, at a second potential difference measuring time after a lapse of a standby period of 24 hours or more from the first potential difference measuring time; and determining whether or not a case-to-negative electrode short circuit exists between the metal case and the negative electrode plate based on a magnitude of the first potential difference, a magnitude of the second potential difference, and a variation between the first potential difference and the second potential difference.

As mentioned above, the potential of the metal case is a floating potential with respect to the negative-electrode potential. When the case-to-negative electrode potential difference is measured, its value is likely to fluctuate and may become extremely small. However, the following facts have been found. When a minute short circuit exists between the metal case and the negative electrode plate, at the time when the process of adjusting the device voltage of the power storage device to the first device voltage (i.e., a voltage adjusting process) is completed or at the first potential difference measuring time, the case-to-negative electrode potential difference indicates almost 0 V or alternatively indicates a certain value and gradually decreases to 0 V. It is conceived that, even if a certain magnitude of case-to-negative electrode potential difference has been generated at the completion time of the voltage adjusting process, the potential of the metal case gradually approaches the negative-electrode potential (the potential of the negative electrode plate) over time due to the presence of a minute short circuit and finally becomes equal to the negative-electrode potential (the potential difference of 0V).

In contrast, the following facts also have been found. When no short circuit exists between the metal case and the negative electrode plate, the case-to-negative electrode potential difference has an upper limit, for example, about 2.8 V for an Li-ion secondary battery with an aluminum case. At the completion time of the voltage adjusting process or at the first potential difference measuring time, therefore, the case-to-negative electrode potential difference generally indicates the upper limit. Even if the case-to-negative electrode potential difference indicates a certain value lower than the upper limit, this potential difference gradually increases over time from the completion time of the voltage adjusting process and converges at a value near the upper limit.

Therefore, in the method for inspecting the power storage device, the first potential difference and the second potential difference of the power storage device, which are the case-to-negative electrode potential differences, are measured respectively at a certain first potential difference measuring time after the device voltage is adjusted to the first device voltage and a second potential difference measuring time after a lapse of a standby period of 24 hours or more from the first potential difference measuring time. Based on the magnitudes of the first and second potential differences and a variation between the first potential difference and the second potential difference, it is determined whether or not a short circuit exists between the metal case and the negative electrode plate. This can appropriately determine the presence/absence of a short circuit between the metal case and the negative electrode plate by suppressing the influence of fluctuations of the case-to-negative electrode potential difference between the negative-electrode potential and the case potential which is a floating potential with respect to the negative-electrode potential.

The "power storage device" may include for example a secondary battery such as a lithium-ion secondary battery, a capacitor such as a lithium-ion capacitor, etc. The "metal case" is a case made of metal, configured to accommodate therein the electrode body, and formed in a rectangular parallelepiped shape, a cylindrical shape, etc. The metal case may be made of aluminum, stainless steel, etc. The "electrode body" may be any electrode body as long as it is configured such that the negative electrode plate or sheet is placed outside the positive electrode plate or sheet in its thickness direction and may include for example a wound electrode body and a stacked electrode body.

As the process of "determining whether or not a case-to-negative electrode short circuit exists between the metal case and the negative electrode plate based on a magnitude of the first potential difference, a magnitude of the second potential difference, and a variation between the first potential difference and the second potential difference", the following techniques may be adoptable. The variation between the first potential difference and the second potential difference is investigated first. Specifically, a battery in which both the first and second potential differences fall within the lower limit range is determined to be short-circuited between the case and the negative electrode plate. In addition, a battery in which the first potential difference is smaller than the upper limit range and further the second potential difference is smaller than the first potential difference, that is, the potential difference decreases over time, is also determined to be short-circuited between the case and the negative electrode plate.

(2) Another aspect of the present disclosure provides a method for manufacturing a power storage device, comprising the method for inspecting a power storage device described in (1), wherein adjusting the power storage device to the first device voltage is to adjust the power storage device to the first device voltage by charging or discharging the power storage device that has undergone initial charge and subsequent charge and discharge, and measuring the first potential difference, measuring the second potential difference, and determining the case-to-negative electrode short circuit are performed on the power storage device in an individual state.

In the above manufacturing method for a power storage device, in manufacturing the power storage device in the individual state, the voltage adjusting process in the foregoing power storage device inspecting method is performed by charging or discharging the power storage device that has undergone initial charge and subsequent charge and discharge, to the first device voltage. In addition, the process of measuring a first potential difference (referred to as a first measuring process), the process of measuring a second potential difference (referred to as a second measuring process), and the process of determining a case-to-negative electrode short circuit (referred to as a case-to-negative electrode short circuit determining process) are performed. This method can therefore manufacture a power storage device having been appropriately determined for the presence/absence of a case-to-negative electrode short circuit.

(3) The method for manufacturing a power storage device, described in (2), further comprises inspecting a self-discharging state of the power storage device after adjusting the power storage device to the first device voltage, wherein measuring the first potential difference and measuring the second potential difference are performed within inspecting the self-discharging state.

In the above manufacturing method for a power storage device, the first measuring process and the second measuring process of the inspecting method for a power storage device are also performed within the process of inspecting a self-discharging state (referred to as a self-discharge inspecting process) which is performed after the voltage adjusting process. This method can therefore shorten the time required to manufacture a power storage device as compared with the case where the first measuring process and the second measuring process are performed separately from the self-discharge inspecting process.

(4) In the method for manufacturing a power storage device, described in (3), inspecting the self-discharging state includes: measuring a pre-leaving device voltage of the power storage device after adjusting the power storage device to the first device voltage; leaving the power storage device, for which the pre-leaving device voltage has been measured, for a leaving period with terminals in an open state; measuring a post-leaving device voltage of the power storage device after leaving the power storage device; checking a self-discharging state of the power storage device using the pre-leaving device voltage and the post-leaving device voltage of the power storage device; after adjusting the power storage device to the first device voltage but before leaving the power storage device, measuring the first potential difference to be performed in parallel with, before, or after measuring the pre-leaving device voltage; and after leaving the power storage device but before checking the self-discharging state, measuring the second potential difference to be performed in parallel with, before, or after measuring the post-leaving device voltage, and the standby period overlaps the leaving period.

In the above manufacturing method for a power storage device, the self-discharge inspecting process includes the process of measuring a pre-leaving voltage, the process of leaving, the process of measuring a post-leaving voltage, and the process of inspecting a self-discharging state as well as the first measuring process and the second measuring process. Furthermore, the first measuring process is performed in parallel with, before, or after the pre-leaving voltage measuring process. The second measuring process is performed in parallel with, before, or after the post-leaving voltage measuring process. The standby period overlaps the leaving period. Therefore, this method can inspect the power storage device by the self-discharge inspecting process for the self-discharging state, and additionally manufacture the power storage device reliably determined for whether or not a short circuit exists between the metal case and the negative electrode plate, using the first and second potential differences obtained in parallel therewith.

The overlap of the standby period and the leaving period indicates that the standby period and the leaving period overlap at least in part on the time axis.

(5) Still another aspect of the present disclosure provides a method for manufacturing a device stack, in which a plurality of the power storage devices are stacked while being insulated from each other, and restrained in a stacking direction by a restraining member, forming a plurality of restrained devices, and the restrained devices are connected with each other, the method comprising: restraining the power storage devices while insulating them from each other, using the restraining member, to constitute an unconnected device stack including the restrained devices that are unconnected with each other, and wherein the method includes the method for inspecting a power storage device according to claim 1, wherein adjusting the power storage device to the first device voltage is to adjust the power storage devices to the first device voltage by charging or discharging the power storage devices that have undergone initial charge and subsequent charge and discharge, before restraining the power storage devices, and measuring the first potential difference, measuring the second potential difference, and determining the case-to-negative electrode short circuit are performed on each of the restrained devices that constitute the unconnected device stack, after restraining the power storage devices.

In the above manufacturing method for a device stack, in manufacturing a device stack, the restraining process is performed to constitute the unconnected device stack, and further each process of the foregoing method for inspecting a power storage device is performed for each of the restrained devices, which are included in the unconnected device stack and more liable to be short-circuited between the metal case and the negative electrode plate due to being restrained, as compared to when not restrained. This method can therefore manufacture a device stack from the restrained devices having been appropriately determined for whether or not each restrained device is short-circuited between the metal case and the negative electrode plate.

Herein, the "device stack" is a stacked restrained-device module in which the power storage devices are stacked while being insulated from each other, and restrained in the stacking direction by the restraining member, forming the restrained devices, and the restrained devices are connected with each other, forming a circuit, such as a series circuit, a parallel circuit, or the like. The technique of connecting the restrained devices, i.e., the power storage devices, may be appropriately selected according to the shapes and the configurations of the positive terminals and the negative terminals of the power storage devices. For example, bus bars are fastened to terminal parts of the positive terminals and the negative terminals using nuts or the terminal parts are connected to the bus bars by laser welding.

In constituting the unconnected device stack including a plurality of restrained devices by stacking and restraining a plurality of power storage devices adjusted to the first device voltage in the voltage adjusting process, the power storage devices may be restrained soon after adjusted to the first device voltage to form a restrained-device module, i.e., the unconnected device stack. Furthermore, the unconnected device stack may be formed by leaving each power storage device for an appropriate period with no restraint or under weaker restraint than the restraint as the device stack, and removing the power storage device(s) determined to be short-circuited in this state.

(6) The method for manufacturing a device stack described in (5), further comprises inspecting an in-stack self-discharging state of each of the restrained devices that constitute the unconnected device stack, wherein measuring the first potential difference and measuring the second potential difference are performed within inspecting the in-stack self-discharging state.

In the above manufacturing method for the device stack, the first measuring process and the second measuring process of the foregoing inspecting method for a power storage device are also performed within the process of inspecting a self-discharging state of each restrained device included in the unconnected device stack (referred to as an in-stack self-discharge inspecting process). This method can therefore shorten the time required to manufacture a device stack as compared with the case where the first measuring process and the second measuring process are performed separately from the in-stack self-discharge inspecting process.

(7) In the method for manufacturing a device stack, described in (6), inspecting the in-stack self-discharging state includes: measuring a restraint pre-leaving device voltage of each of the restrained devices after restraining the power storage devices; leaving the restrained devices, for each of which the restraint pre-leaving device voltage has been measured, for a restraint leaving period with terminals in an open state; measuring a restraint post-leaving device voltage of each of the restrained devices after leaving the restrained devices; checking a restraint self-discharging state of each of the restrained devices using the restraint pre-leaving device voltage and the restraint post-leaving device voltage of the corresponding restrained device; after restraining the storage devices but before leaving the restrained devices, measuring the first potential difference to be performed in parallel with, before, or after measuring the restraint pre-leaving device voltage; and after leaving the restrained devices but before checking the restraint self-discharging state, measuring the second potential difference to be performed in parallel with, before, or after measuring the restraint post-leaving device voltage, and the standby period overlaps the restraint leaving period.

In the above manufacturing method for a device stack, the in-stack self-discharge inspecting process includes the process of measuring a restraint pre-leaving voltage, the process of leaving the restrained devices, the process of measuring a restraint post-leaving voltage, and the process of checking a restraint self-discharge as well as the first measuring process and the second measuring process. Further, the first measuring process is performed in parallel with, before, or after the restraint pre-leaving voltage measuring process. The second measuring process is performed in parallel with, before, or after the restraint post-leaving voltage measuring process. The standby period overlaps the restraint leaving period. Therefore, this method can inspect each restrained device by the in-stack self-discharge inspecting process for the self-discharging state, and additionally manufacture the device stack reliably determined for whether or not a short circuit exists between the metal case and the negative electrode plate of each restrained device, using the first and second potential differences obtained in parallel with the above inspection.

The overlap of the restraint standby period and the restraint leaving period indicates that the restraint standby period and the restraint leaving period overlap at least in part on the time axis.

DETAILED DESCRIPTION OF THE EXEMPLARY EMBODIMENTS

First Embodiment

Figure 1:
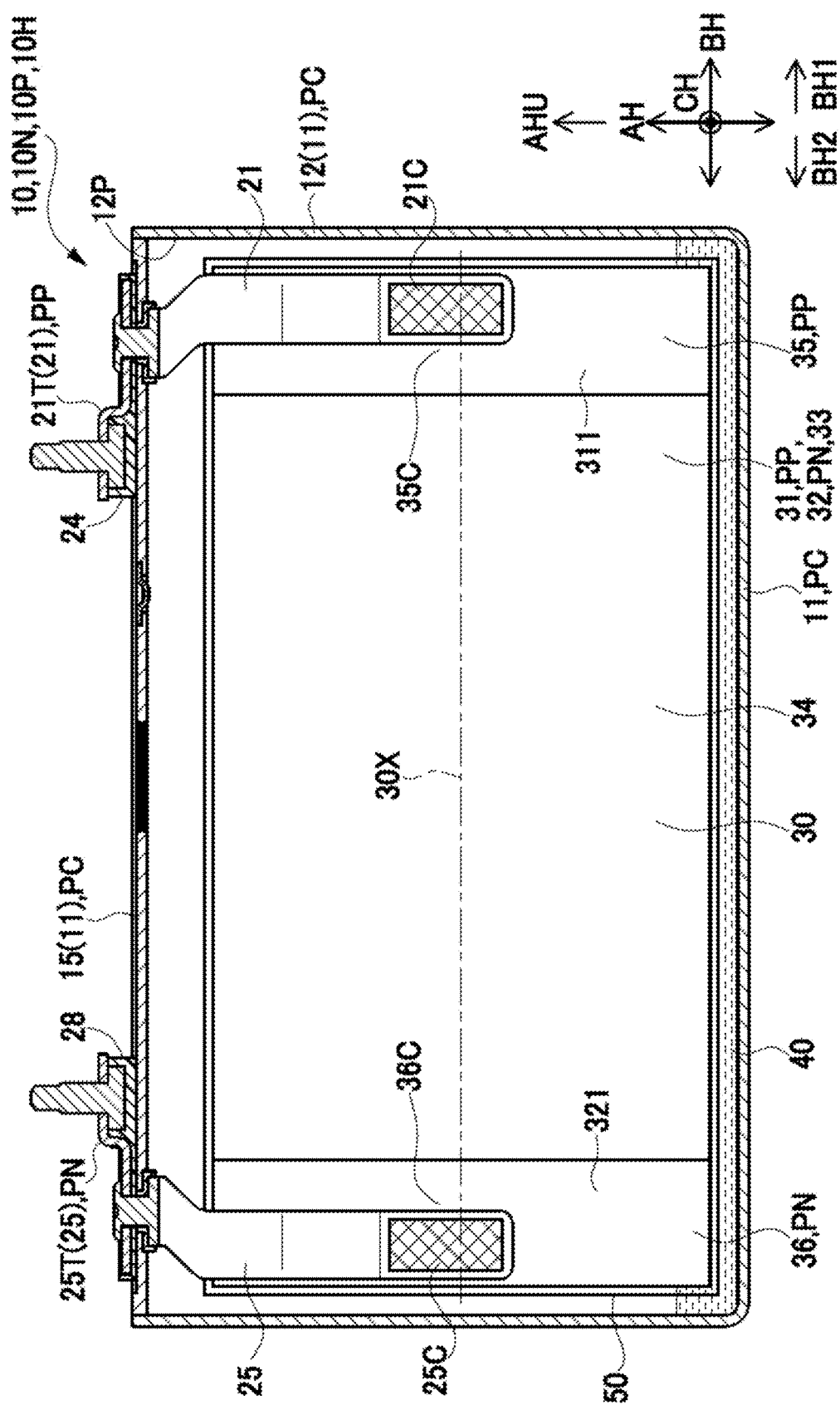
FIG. 1 is a cross-sectional view of a battery in a width direction in first and second embodiments.
Figure 2:
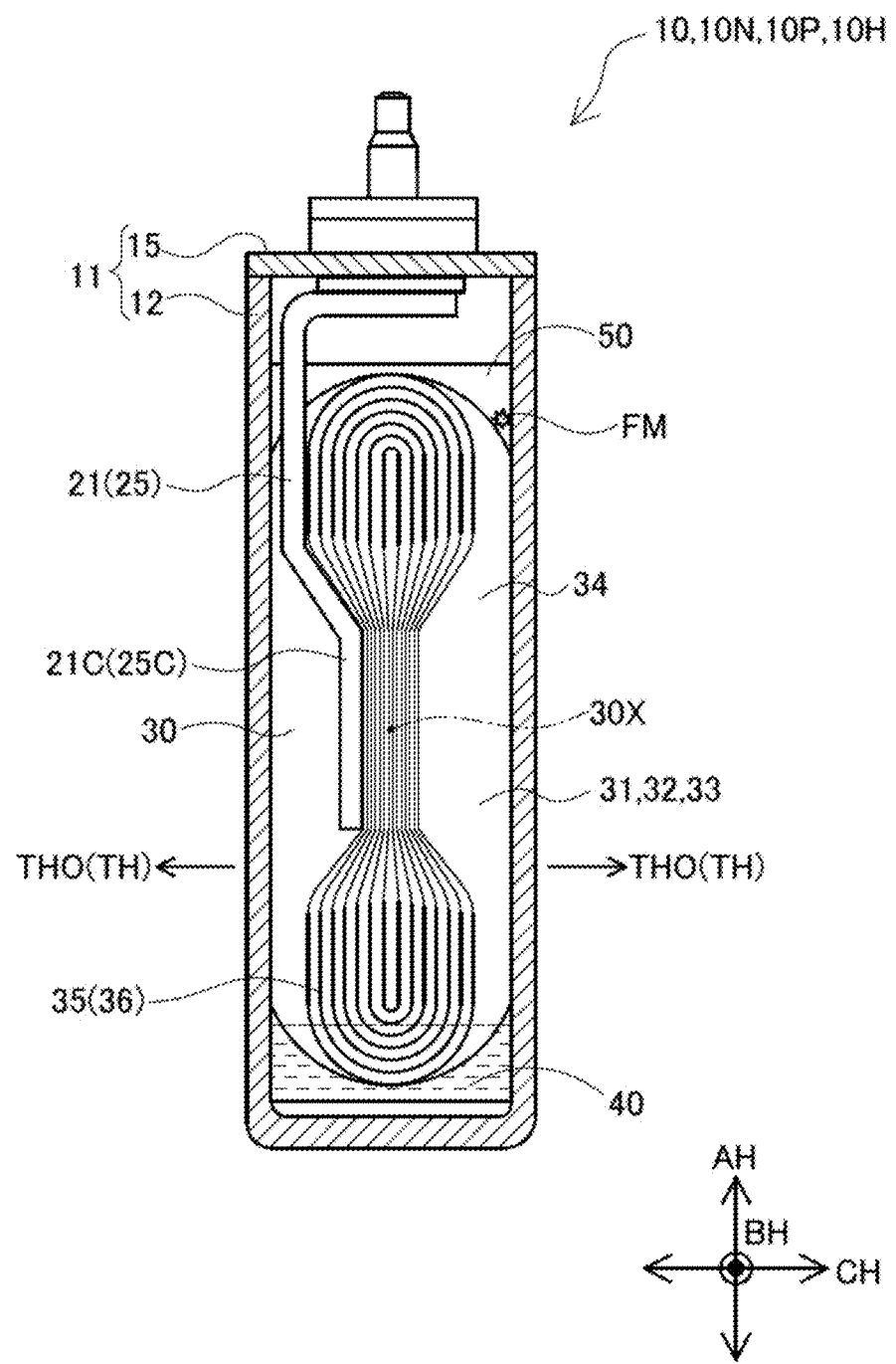
FIG. 2 is a cross-sectional view of the battery in a thickness direction in the first and second embodiments.

A detailed description of a first embodiment of this disclosure will now be given referring to the accompanying drawings. FIGS. 1 and 2 are cross-sectional views of a battery 10, which is one example of a power storage device, in a battery width direction BH and a battery thickness direction CH respectively, in the first and second embodiments. This battery 10 is a sealed lithium-ion secondary battery having a rectangular box-like shape, which is mounted in a vehicle, such as a hybrid car, plug-in hybrid car, and an electric car, a drone, or various devices.

The battery 10 includes a case 11, an electrode body 30 accommodated in the case 11, a positive terminal 21 and a negative terminal 25, which are supported in the case 11 and connected to the electrode body 30 within the case 11, and protrude out of the case 11, i.e., upward in FIG. 1.

The case 11 has a rectangular parallelepiped box-like shape made of metal, e.g., aluminum in the first embodiment. This case 11 includes a case body 12 of a bottom-closed angular-cylindrical shape having an opening 12P on the upper side AHU in the battery height direction AH and a lid 15 having a rectangular plate-like shape that closing the opening 12P. It is to be noted that the battery height direction AH, the battery width direction BH, and the battery thickness direction CH in the present embodiment are defined as indicated by arrows in FIGS. 1 and 2.

To the lid 15, the positive terminal 21 made of aluminum penetrating through the lid 15 is fixedly provided and insulated from the lid 15 by a positive insulation member 24, and the positive terminal 21 includes a positive terminal part 21T exposed outside and a connection part 21C electrically connected to a positive current collecting part 35 (described later) of the electrode body 30. Further, to the lid 15, the negative terminal 25 made of copper penetrating through the lid 15 is fixedly provided and insulated from the lid 15 by a negative insulation part 28, and the negative terminal 25 includes a negative terminal part 25T exposed outside and a connection part 25C electrically connected to a negative current collecting part 36 (described later) of the electrode body 30.

The case 11 contains an electrolyte 40 together with the electrode body 30. A part of the electrolyte 40 is impregnated in the electrode body 30 and the remaining is accumulated on the bottom in the case 11. The electrode body 30 is covered with an insulation film 50 having a bottomed rectangular pouch-like shape that opens on the upper side AHU in the battery height direction AH, so that a negative electrode plate or sheet 32, described below, of the electrode body 30 is insulated from the case 11.

The electrode body 30 is a flat wound electrode body that has a generally flat, rectangular parallelepiped shape, in which a strip-shaped positive electrode plate or sheet 31, a strip-shaped negative electrode plate 32, and two strip-shaped separators 33 each made of a porous resin film and individually interposed between the positive electrode plate 31 and the negative electrode plate 32 are laminated and wound together about an axis 30X and shaped into a flat form, as shown in FIGS. 1 and 2. However, since the negative electrode plate 32 and the separators 33 are longer than the positive electrode plate 31, the negative electrode plate 32 extends to be placed on the outside THO, i.e., on the outer circumferential side, in the positive-electrode-plate thickness direction TH of the positive electrode plate 31 wound together with the negative electrode plate 32 and the separators 33, and further the separators 33 extend to be placed on the outermost circumferential side relative to the positive electrode plate 31 and the negative electrode plate 32. Therefore, regarding short circuits between the electrode body 30 and the case 11, only a short circuit between the negative electrode plate 32 and the case 11 should be considered.

As shown in FIG. 1, the electrode body 30 includes a positive current collecting part 35, formed of a positive current collecting foil 311 of the positive electrode plate 31 wound spirally and exposed on the one side BH1 in the battery width direction BH along the axis 30X, i.e., on the right side in FIG. 1, and a negative current collecting part 36, formed of a negative current collecting foil 321 of the negative electrode plate 32 wound spirally and exposed on the other side BH2, i.e., on the left side in FIG. 1. In the electrode body 30, a middle part between the positive current collecting part 35 and the negative current collecting part 36 in the battery width direction BH is a body part 34.

In the present embodiment, flat portions of the positive current collecting part 35 of the electrode body 30 are in close contact with each other in the battery thickness direction CH and welded to the connection part 21C of the positive terminal 21 by laser welding, and configured to electrically connect to an external circuit member outside the battery 10. Further, flat portions of the negative current collecting part 36 of the electrode body 30 are in close contact with each other in the battery thickness direction CH and welded to the connection part 25C of the negative terminal by laser welding, and configured to electrically connect to the external circuit member outside the battery 10. The thus configured electrode body 30 is supported by the lid 15, i.e., the case 11, through the positive terminal 21 and the negative terminal 25.

As described above, the positive electrode plate 31 and the negative electrode plate 32 of the electrode body 30 are insulated from the case 11 made of aluminum by the insulation film 50 enclosing those electrode plates 31 and 32, in addition to the separators 33. However, for example, foreign substances FM, such as spatters generated during laser welding to weld the lid 15 to the case body 12 to close the opening 12P, may enter in the case 11 and be trapped between the case 11 and the body part 34 of the electrode body 30, as shown in FIG. 2. In such a case, the foreign substances FM may pierce through the insulation film 50 and the separators 33, not only contacting the case 11 but also contacting the negative electrode plate 32 placed on the outside THO in the positive electrode plate thickness direction relative to the positive electrode plate 31, causing a short circuit (a minute short circuit) between the case 11 and the negative electrode plate 32. As is easily understood, when the battery (the case 11) is compressed in the battery thickness direction CH, i.e., a right-left direction in FIG. 2, the case 11 and the negative electrode plate 32 of the electrode body 30 are apt to be short-circuited through the foreign substances FM.

Inherently, a case potential PC of the case 11 insulated from the negative electrode plate 32 of the electrode body 30 is a floating potential relative to a negative-electrode potential PN of the negative electrode plate 32. However, if the case 11 and the negative electrode plate 32 are short-circuited via the foreign substances FM, the case potential PC is affected by the negative-electrode potential PN. Specifically, in many cases, the case potential PC becomes equal to the negative-electrode potential PN, and a potential difference EF between the case potential PC (relative to the negative-electrode potential PN) and the negative-electrode potential PN, which will be referred to as a case-to-negative electrode potential difference, becomes 0 (EF=PC−PN=0). The presence of a short circuit between the case 11 and the negative electrode plate 32 causes the above-described defects, resulting in a defective battery 10N, which needs be eliminated, or removed.

Figure 4:
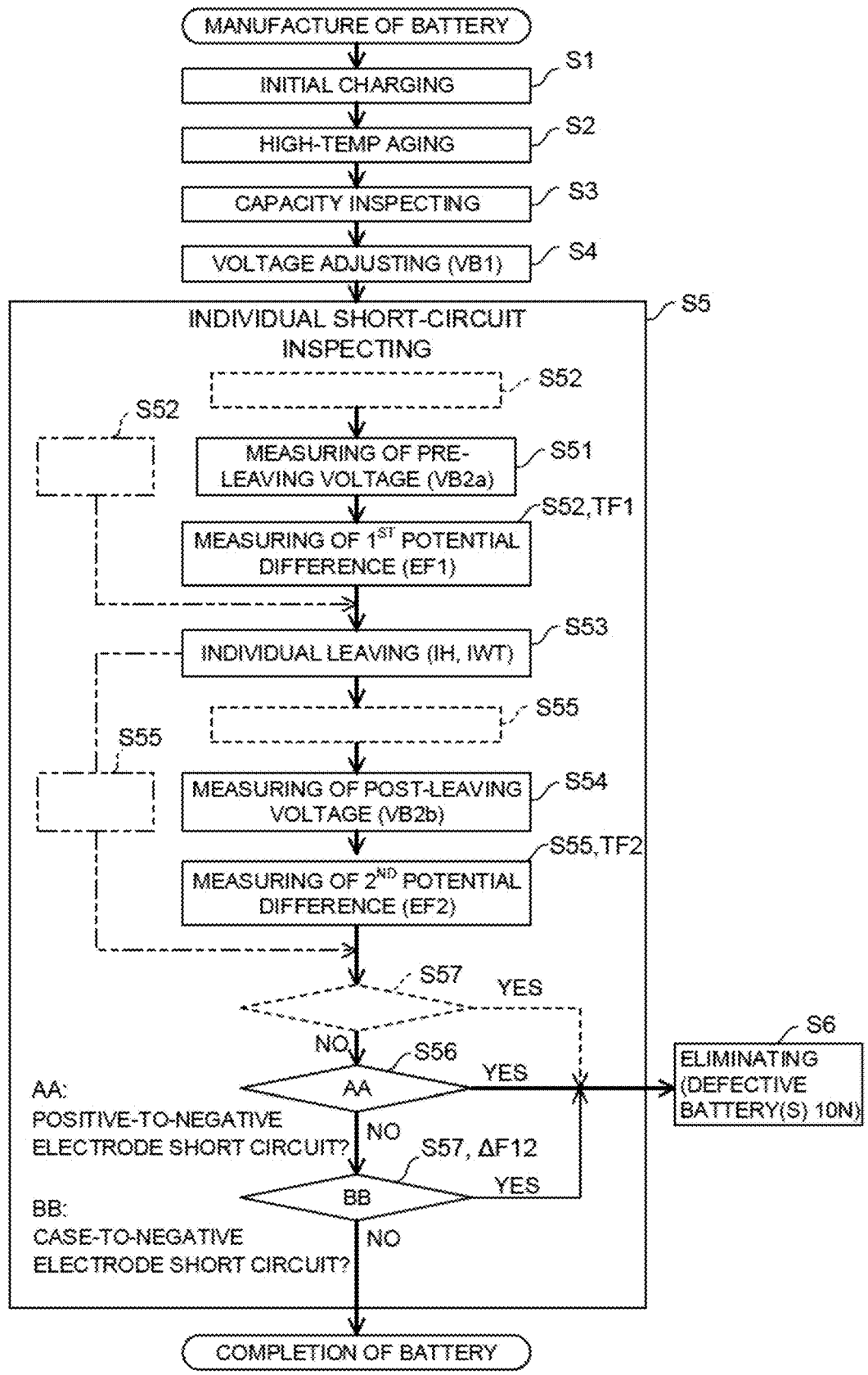
FIG. 4 is a flowchart showing a process of manufacturing the battery in the first and second embodiments.

Therefore, many batteries 10 are subjected to an initial charging step S1, a high-temperature aging step S2, a capacity inspecting step S3, and a voltage adjusting step S4, which will be described later, to adjust each battery voltage VB to a first voltage VB1 (VB1=3.750 V) (see FIG. 4). Furthermore, at appropriate times, a digital multimeter (described below) is connected to the case 11 and the negative terminal 25 to measure the potential difference EF between the case potential PC and the negative electrode potential PN, and the transition of changes in the potential difference EF is investigated. However, since the potential difference EF (the case-to-negative electrode potential difference) is inherently a floating potential as mentioned above, the measurement value of the potential difference EF fluctuates. Moreover, each battery 10 having been investigated about the transition of the potential difference EF is disassembled to check whether or not the case 11 and the negative electrode plate 32 are short-circuited. As a result, for the batteries 10 after having undergone the voltage adjusting step S4, four patterns PT1 to PT4 were found out based on the magnitudes of and the changes in the potential difference EF between the case potential PC and the negative-electrode potential PN, and the relationships between those patterns PT1 to PT4 and the presence/absence of a short circuit between the case and the negative electrode, hereinafter referred to as a case-to-negative electrode short circuit, were also found out.

Figure 3:
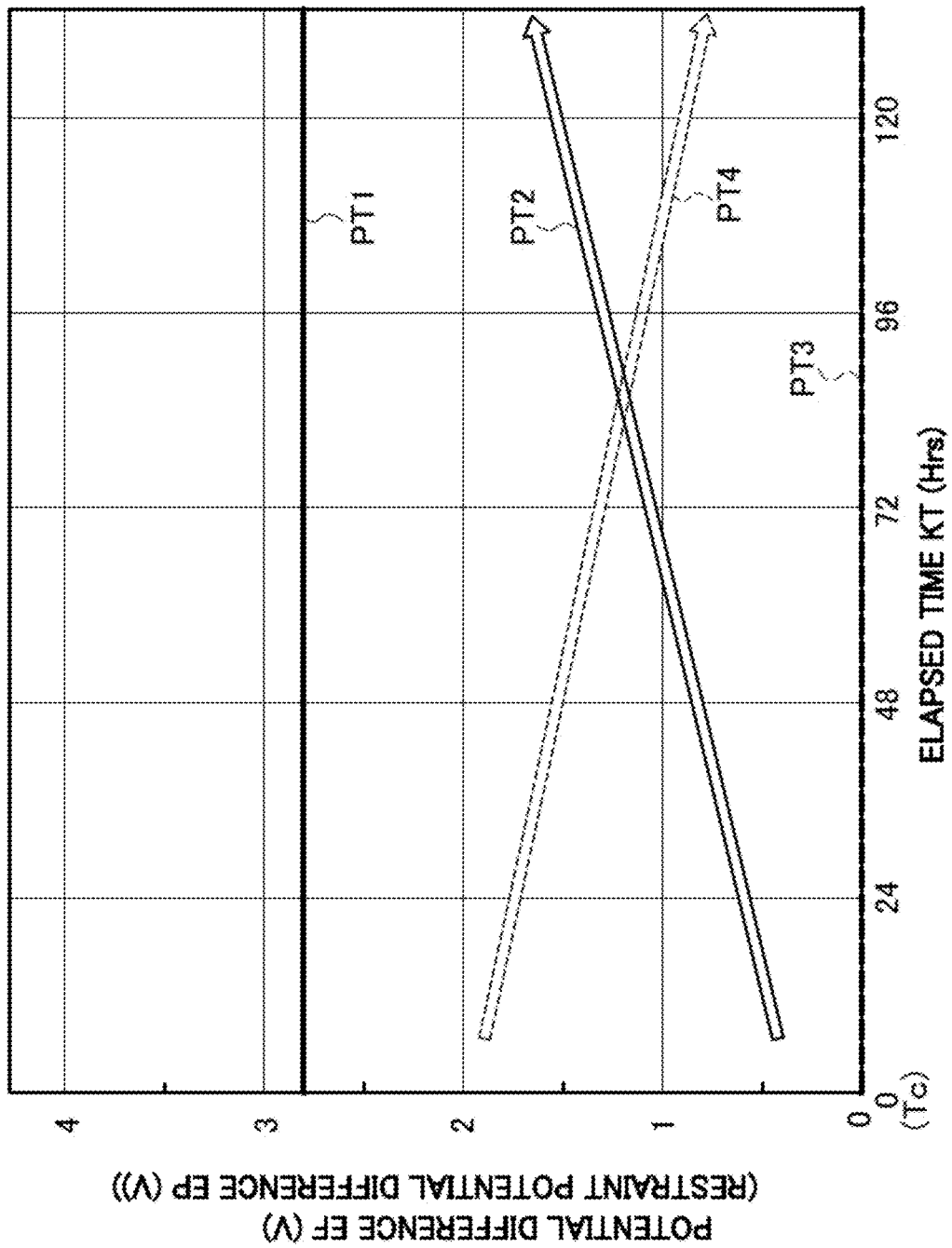
FIG. 3 is a graph showing patterns of changes in potential difference between a case and a negative electrode plate in a battery or a restrained battery in the first and second embodiments.

The above relationships will be described below referring to the graph in FIG. 3. In FIG. 3, the horizontal axis is an elapsed time KT from an adjustment completion time Tc (described below) at which the voltage adjustment is completed in the voltage adjusting step S4, and the vertical axis is a potential difference EF or a restraint potential difference EP described below. The first pattern PT1 is the pattern taken by most of the batteries 10 having no case-to-negative electrode short circuit. In this first pattern PT1, the potential difference EF falls within an upper limit range as indicated by a thick solid line, regardless of the elapsed time KT. For the batteries in the present embodiment, the upper limit range is 2.1 to 2.9 V. The reason why the upper range of the potential difference EF falls within the aforementioned value range is not clear, but may be related to that the immersion potential of the metal (aluminum) forming the case 11 to the electrolyte 40 is generally 2.8 V.

The second pattern PT2 is the pattern taken by a battery other than the battery(s) of the first pattern PT1, among the batteries 10 having no case-to-negative electrode short circuit. In this second pattern PT2, as indicated by a blank arrow plotted with a solid line, the potential difference EF falls below a lower limit value of the aforementioned upper limit range, i.e., 2.0 V or less, at an early stage in the elapsed time KT, but increases as the elapsed time KT increases. The potential difference EF of the battery 10 exhibiting this second pattern PT2 becomes a value within the aforementioned upper limit range, i.e., 2.1 to 2.9 V in the first embodiment, after a sufficient elapsed time KT has passed.

The third pattern PT3 is the pattern taken by most of the batteries 10 having a case-to-negative electrode short circuit. In this third pattern PT3, as indicated by a broken thick line, the potential difference EF is equal to a value within the lower limit range, regardless of the elapsed time KT. For the batteries 10 in the present embodiment, the lower limit range is 0.4 V or less (i.e., 0 to 0.4 V). In this third pattern PT3, the potential difference EF is almost 0 V. The reason why the potential difference EF is almost 0 V is considered that the case potential PC becomes almost equal to the negative-electrode potential PN due to a case-to-negative electrode short circuit.

The fourth pattern PT4 is the pattern taken by a battery other than the battery(s) of the third pattern PT3, among the batteries 10 having a case-to-negative electrode short circuit. In this fourth pattern PT4, as indicated by a blank arrow plotted with a broken line, the potential difference EF is smaller than the aforementioned upper limit range at the early stage of the elapsed time KT and then decreases as the elapsed time KT increases. For the batteries 10 of this pattern PT4 in the present embodiment, the potential difference EF is less than 2.1 V at the early stage of the elapsed time KT and decreases as the elapsed time KT increases. The reason why the potential difference EF decreases as the elapsed time KT increases is considered that the case potential PC gradually approaches the negative-electrode potential PN due to a case-to-negative electrode short circuit.

Therefore, using the above findings, in the process of manufacturing the batteries 10, the presence/absence of a case-to-negative electrode short circuit is detected in the following manner. In manufacturing the batteries 10, each battery 10 is usually checked for a self-discharging state, specifically, for whether or not a short circuit exists between the positive electrode plate 31 and the negative electrode plate 32. In the first embodiment, therefore, the batteries 10 are manufactured as below.

The manufacture of the battery 10 will be described below referring to FIG. 4. Batteries 10 which have not been charged yet (i.e., uncharged batteries 10) are produced first. This manufacturing method for sealed batteries 10 each including a rectangular parallelepiped case 11 is well known and thus the details thereof are omitted herein. In an initial charging step S1 (see FIG. 4), the uncharged batteries 10 are initially charged up to 60% to 100% SOC by CCCV charging under a room temperature. In the present embodiment, for example, the CCCV charging is performed with a constant current of 7 C, a cut voltage of 3.75 V (equivalent to 60% SOC), and a cut-off current of 0.3 C under an ambient temperature of 25° C. In a high-temperature aging step S2, a high-temperature aging treatment is performed by leaving each initially charged battery 10 to stand with terminals in an open state for 10 to 200 hours under an ambient temperature of 50 to 80° C.; for example, for 18 hours at 70° C. in the present embodiment. After these batteries 10 are cooled, a capacity inspecting step S3 is performed by charging the batteries 10 to 100% SOC and further discharging the batteries 10 to 0% SOC, and measuring the capacity of each battery 10, concretely, the discharge capacity of each battery 10 in the above case.

In a voltage adjusting step S4, subsequently, the batteries 10 are each charged under a room temperature until respective battery voltages VB become a first voltage VB1 falling within a range of 30% to 100% SOC. In the present embodiment, for example, as in the initial charging step S1, CCCV charging is performed under an ambient temperature 25° C., with a constant current of 7 C, a cut voltage of 3.75 V (equivalent to 60% SOC), and a cut-off current of 0.3 C. Specifically, the battery voltage VB of each battery 10 is adjusted once to the same first voltage VB1 (VB1=3.75 V in the present embodiment). The elapsed time KT is counted from the adjustment completion time Tc at which charging of each battery 10 from the battery voltage VB to the first voltage VB1 in the voltage adjusting step S4 is completed.

In an individual short-circuit inspecting step S5, subsequently, each of the batteries 10 having undergone the voltage adjusting step S4 is inspected for a short circuit in an individual state, i.e., in an unrestrained state. Specifically, a pre-leaving voltage measuring step S51 is performed to measure a pre-leaving second voltage VB2a, which is the battery voltage VB of each battery 10 before leaving.

Then, a first potential difference measuring step S52 is performed to measure a first potential difference EF1 corresponding to the case-to-negative electrode potential difference by connecting a digital multimeter with an internal resistance of 1 MΩ or higher to the case 11 and the negative terminal part 25T. This time of measuring the first potential difference EF1 is assumed as a first time TF1.

In the first embodiment, the first potential difference measuring step S52 is performed following the pre-leaving voltage measuring step S51. Contrary to this, however, the first potential difference measuring step S52 may be performed before the pre-leaving voltage measuring step S51, as indicated by a broken line in FIG. 4. As another alternative, the first potential difference measuring step S52 may also be performed in parallel with the pre-leaving voltage measuring step S51 as indicated by a two-dotted dashed line in FIG. 4.

In an individual leaving step S53, subsequently, the batteries 10 with the positive terminal 21 and the negative terminal 25 in an open state are left in an unrestrained (i.e., individual) condition or a slightly restrained condition for an individual leaving period IH (e.g., IH≥5.0 days, i.e., IH≥120 hours in the first embodiment) at an ambient temperature of 25° C. Then, in a post-leaving voltage measuring step S54, a post-leaving second voltage VB2b, which is the battery voltage VB of each battery 10 obtained after a lapse of the individual leaving period IH, is measured.

In a second potential difference measuring step S55, a second potential difference EF2 corresponding to the case-to-negative electrode potential difference is measured in the same manner as the first potential difference EF1. When this time of measuring the second potential difference EF2 is assumed as a second time TF2, an individual standby period IWT from the first time TF1 to the second time TF2 overlaps the individual leaving period IH. In the first embodiment, therefore, the individual standby period IWT is also equal to or longer than 5.0 days (IWT≥5.0 days, i.e., IWT≥120 hours) as with the individual leaving period IH.

In the first embodiment, the second potential difference measuring step S55 is performed following the post-leaving voltage measuring step S54. Contrary to this, however, the second potential difference measuring step S55 may be performed before the post-leaving voltage measuring step S54, as indicated by a broken line in FIG. 4. As another alternative, the second potential difference measuring step S55 may also be performed in parallel with the post-leaving voltage measuring step S54, as indicated by a two-dotted dashed line in FIG. 4.

In an individual first determining step S56, using the pre-leaving second voltage VB2a and the post-leaving second voltage VB2b, it is determined whether or not each electrode body 30 is short-circuited between the positive electrode plate 31 and the negative electrode plate 32, i.e., each electrode body 30 has a positive-to-negative electrode short circuit. Specifically, this determination of the presence/absence of the positive-to-negative electrode short circuit is performed by comparing a drop rate, which is obtained by dividing a difference between the pre-leaving second voltage VB2a and the post-leaving second voltage VB2b by the individual leaving period IH ((VB2a−VB2b)/IH), with a threshold drop rate separately obtained in advance. If NO in step S56, i.e., if the drop rate is smaller than the threshold drop rate, that is, if the battery voltage VB slowly decreases, the battery is determined to have no short circuit, and the process goes to the individual second determining step S57. In contrast, if YES in step S56, i.e., if the drop rate is larger than the threshold drop rate, that is, if the battery voltage VB rapidly decreases, the battery 10 is determined to have a positive-to-negative electrode short circuit, and the process goes to a battery eliminating step S6.

In a subsequent individual second determining step S57, it is determined whether or not each battery 10 under test is short-circuited between the case 11 and the negative electrode plate 32 based on the magnitude of the first potential difference EF1, the magnitude of the second potential difference EF2, and a potential difference variation amount ΔF12 indicating a variation between these potential differences (ΔF12=EF2−EF1). Specifically, it is determined, using the foregoing findings of the patterns PT1 to PT4 (see FIG. 3), whether or not the battery 10 under test has a case-to-negative electrode short circuit. More specifically, in the individual second determining step S57, the batteries 10 corresponding to the third pattern PT3 and the fourth pattern PT4 are sorted out. In other words, a battery(s) 10 in which both the first potential difference EF1 and the second potential difference EF2 are included within the lower limit range (a range of 0.4 V or less in the first embodiment), i.e., EF1<0.4 V and EF2<0.4 V, or alternatively, a battery(s) 10 in which the first potential difference EF1 is smaller than the upper limit range (a range of 2.1 to 2.9 V in the first embodiment) and the second potential difference EF2 is smaller than the first potential difference EF1 (EF1>EF2), is determined to have a case-to-negative electrode short circuit (YES in S57), the process goes to the battery eliminating step S6. In contrast, in the cases other than the above, the battery 10 under test is determined to have no short circuit (NO in S57). Thus, the individual short-circuit inspecting step S5 is terminated, and the battery 10 is completed.

In the first embodiment, the individual second determining step S57 is performed following the individual first determining step S56. Contrary to this, however, the individual second determining step S57 may be performed before the individual first determining step S56, as indicated by a broken line in FIG. 4.

In the battery eliminating step S6, the defective battery(s) 10N that has been determined to have a positive-to-negative electrode short circuit or a case-to-negative electrode short circuit is eliminated from a manufacturing process line.

The inspecting method and the manufacturing method for the batteries 10 in the present embodiment can appropriately determine the presence/absence of a short circuit between the case 11 and the negative electrode plate 32 in each battery 10 by suppressing the influence of fluctuations of the potential difference EF between the negative-electrode potential PN and the case potential PC which is a floating potential with respect to the negative-electrode potential PN. Further, the method can manufacture the batteries 10 each having been appropriately determined for whether or not each battery 10 has a case-to-negative electrode short circuit. Specifically, of the batteries 10 under test, a defective battery(s) 10N having a case-to-negative electrode short circuit is eliminated from the manufacturing process line, so that a battery(s) 10 having no short circuit can be manufactured appropriately.

In the foregoing method for manufacturing the batteries 10, within the individual short-circuit inspecting step S5 which is performed after the voltage adjusting step S4, the first potential difference measuring step S52 and the second potential difference measuring step S55, which are the method for inspecting the batteries 10, are also performed. This method can shorten the period required to manufacture the batteries 10 as compared to when the first and second potential difference measuring steps are performed separately from the individual short-circuit inspecting step S5.

In the manufacturing method for the batteries 10 in the first embodiment, the individual short-circuit inspecting step S5 includes the first potential difference measuring step S52 and the second potential difference measuring step S55 in addition to the pre-leaving voltage measuring step S51, individual leaving step S53, post-leaving voltage measuring step S54, and individual first determining step S56. Further, the first potential difference measuring step S52 is performed in parallel with, before, or after the pre-leaving voltage measuring step S51. The second potential difference measuring step S55 is performed in parallel with, before, or after the post-leaving voltage measuring step S54. The individual standby period IWT overlaps the individual leaving period IH. Therefore, this method can inspect the batteries 10 by the individual short-circuit inspecting step S5 for the self-discharging state, specifically, for whether or not each battery 10 has a positive-to-negative electrode short circuit, and additionally can manufacture the batteries 10 each reliably determined for whether or not each battery 10 is short-circuited between the case 11 and the negative electrode plate 32 using the first potential difference EF1 and the second potential difference EF2 obtained in parallel with the above inspection.

Second Embodiment

Figure 5:
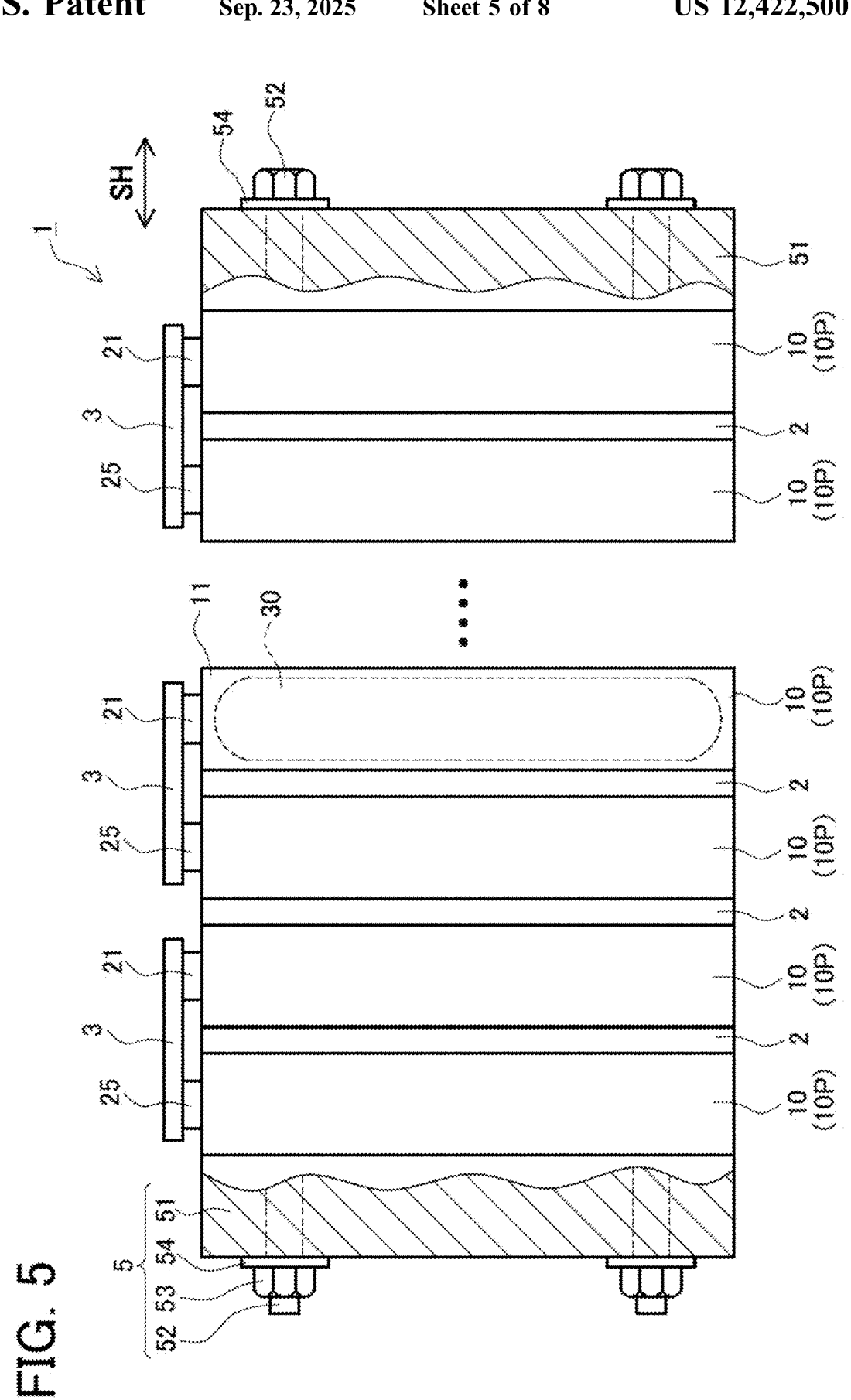
FIG. 5 is an explanatory view of a battery stack in the second embodiment.

A battery stack 1 in a second embodiment will be described below referring to the accompanying drawings. FIG. 5 is an explanatory view of the battery stack 1 in the second embodiment, which is one example of a device stack. The battery stack 1 includes a plurality of batteries 10, e.g., twenty-eight batteries 10 in the present embodiment, which are stacked and restrained in a fixed size by restraining members 5, as shown in FIGS. 1 and 2. Each battery 10 has a rectangular parallelepiped shape, which is one example of a power storage device. In this battery stack 1, the batteries are stacked by alternately interposing spacers 2 in a stacking direction SH corresponding to a battery thickness direction CH (i.e., a right-left direction in FIG. 2), and restrained under pressure in the stacking direction SH by the restraining members 5. To be specific, the batteries 10 restrained as above, hereinafter referred to as restrained batteries 10P, and the spacers 2 are alternately stacked and held between a pair of restraining plates 51 so that each restrained battery 10P is pressed in the stacking direction SH by use of restraining bolts 52 extending in the stacking direction SH, bridging between the restraining plates 51, and nuts 53 and washers 54 screwed on the bolts 52. The positive terminal 21 and the negative terminal 25 of each restrained battery 10P are connected to those of adjacent restrained batteries 10P through bus bars 3. In the battery stack 1 in the second embodiment, as shown in FIG. 5, the restrained batteries 10P are alternately reversed so that the positive terminals 21 and the negative terminals 25 of the adjacent restrained batteries 10P are alternately arranged in line in the stacking direction SH, and the restrained batteries 10P are connected in series with each other through the connected bus bars 3. The battery stack 1 is mounted, in use, for example in vehicles such as a hybrid car, a plug-in hybrid car, an electric car.

The foregoing first embodiment describes, by classification into four patterns PT1 to PT4, the relationship between the potential difference EF between the negative-electrode potential PN and the case potential PC (i.e., the case-to-negative electrode potential difference) and the presence/absence of the case-to-negative electrode short circuit in each battery 10 in an individual, or separate, state, having undergone the initial charging step S1 to the voltage adjusting step S4. In the individual second determining step S57, using the above patterns PT1 to PT4, it is determined whether or not each individual battery 10 under test has the case-to-negative electrode short circuit. Furthermore, it also has been found that, for the restrained batteries 10P constituting the battery stack 1 in the second embodiment, the relationship between the restraint potential difference EP between the negative-electrode potential PN and the case potential PC (the case-to-negative electrode potential difference) and the presence/absence of the case-to-negative electrode short circuit can be classified into four patterns PT1 to PT4 as above (see FIG. 3). In the manufacturing method in the second embodiment described below, as in the first embodiment, it is thus determined whether or not each of the batteries 10 under test has the case-to-negative electrode short circuit. In addition, for the restrained batteries 10P of the battery stack 1, it is determined using the same method whether or to each restrained battery 10P has the case-to-negative electrode short circuit.

Figure 6:
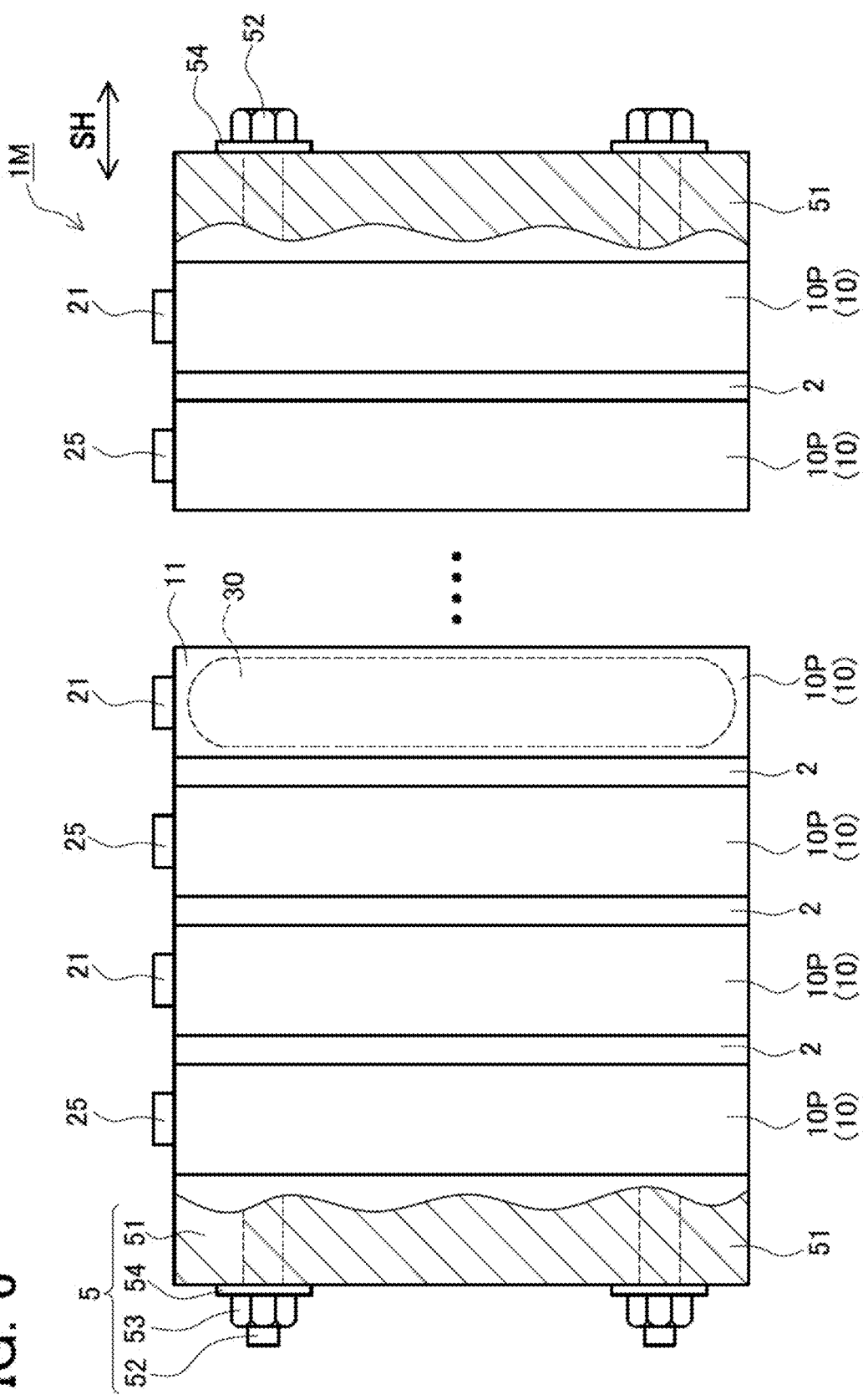
FIG. 6 is an explanatory view of an unconnected battery stack in the second embodiment.

The manufacture of the battery stack 1 will be described below, referring to FIGS. 6 to 8. Batteries 10 which have not been charged yet (i.e., uncharged batteries 10) are manufactured in advance by known methods (see FIG. 7). Then, as in the first embodiment, the initial charging step S1, high-temperature aging step S2, and capacity inspecting step S3 are performed, and further the voltage adjusting step S4 is performed to charge the batteries 10 until the battery voltage VB of each battery 10 is adjusted once to the same first voltage VB1, concretely to 3.75 V. As in the first embodiment, furthermore, the individual short-circuit inspecting step S5 (see FIG. 4) is performed to determine whether or not each battery 10 has a positive-to-negative electrode short circuit in the individual first determining step S56 and whether or not each battery 10 has a case-to-negative electrode short circuit in the individual second determining step S57. The defective battery(s) 10N determined to be short-circuited in those determining steps S56 or S57 is eliminated from a manufacturing process line in the battery eliminating step S6. In contrast, The battery(s) 10 determined not to be short-circuited in the determining steps S56 and S57 is obtained.

In the following restraining step S27 (see FIG. 7), the batteries 10 having been determined to have no short circuit in the foregoing individual short-circuit inspecting step S5 (i.e., the individual first determining step S56 and the individual second determining step S57) are combined together using the spacers 2 and the restraining members 5 to constitute a stack of unconnected batteries, which will be referred to as an unconnected battery stack 1M (see FIG. 6) by a known method. In this unconnected battery stack 1M, the batteries 10 are referred to as restrained batteries 10P that are pressed and restrained in the stacking direction SH, i.e., a horizontal direction in FIG. 6. Accordingly, in the electrode body 30 of each restrained battery 10P, the positive electrode plate 31 and the negative electrode plate 32 with the separators 33 interposed therebetween are compressed in a thickness direction corresponding to the stacking direction SH. However, unlike the battery stack 1 (see FIG. 5), no bus bar 3 is attached and thus the positive terminal 21 and the negative terminal 25 are not connected between the adjacent restrained batteries 10P, so that each restrained batteries 10P is in an open circuit state. For this unconnected battery stack 1M, the restrained batteries 10P under restraint are individually inspected for a positive-to-negative electrode short circuit and a case-to-negative electrode short circuit. After this restraining step S27, a plurality of (e.g., twenty-eight in the present embodiment) restrained batteries 10P included in a single, i.e., the same, unconnected battery stack 1M (or the battery stack 1) are treated as one group.

In the second embodiment, following the restraining step S27, a restraint short-circuit inspecting step S28 (see FIG. 8) is performed by two different short circuit tests on each restrained battery 10P under restraint, i.e., under compression, in the unconnected battery stack 1M to detect whether or not each restrained battery 10P is short-circuited.

In a pre-leaving voltage measuring step S281 (see FIG. 8) of the restraint short-circuit inspecting step S28, each of the restrained batteries 10P constituting the unconnected battery stack 1M is measured for a pre-leaving third voltage VB3$a$ which is the battery voltage VB of the restrained battery 10P.

In a first potential difference measuring step S282, a restraint first potential difference EP1 which is a case-to-negative electrode potential difference is measured in the similar manner to the first potential difference EF1. This measuring time is assumed as a restraint first time TP1. In the second embodiment, the first potential difference measuring step S282 is performed following the pre-leaving voltage measuring step S281. Contrary to this, however, the first potential difference measuring step S282 may be performed before the pre-leaving voltage measuring step S281, as indicated by a broken line in FIG. 8. As another alternative, the first potential difference measuring step S282 may be performed in parallel with the pre-leaving voltage measuring step S281, as indicated by a two-dotted dashed line in FIG. 8.

Then, in a restraint leaving step S283, the restrained batteries 10P of the unconnected battery stack 1M are left, in an open circuit state, for a restraint leaving period PH (e.g., PH≥5.0 days, i.e., PH≥120 hours in the second embodiment) at an ambient temperature of 25° C. Then, in a post-leaving voltage measuring step S284, a post-leaving third voltage VB3$b$, which is the battery voltage VB of each restrained battery 10P obtained after a lapse of the restraint leaving period PH, is measured.

In a second potential difference measuring step S285, a restraint second potential difference EP2 which is a case-to-negative electrode potential difference is measured in the same manner as the restraint first potential difference EP1. When this time of measuring the restraint second potential difference EP2 is assumed as a restraint second time TP2, a restraint standby period PWT from the restraint first time TP1 to the restraint second time TP2 overlaps the restraint leaving period PH. In the second embodiment, therefore, the restraint standby period PWT is also equal to or longer than 5.0 days (PTW≥5.0 days, i.e., PWT≥120 hours) as with the restraint leaving period PH.

In the second embodiment, the second potential difference measuring step S285 is performed following the post-leaving voltage measuring step S284. Contrary to this, however, the second potential difference measuring step S285 may be performed before the post-leaving voltage measuring step S284, as indicated by a broken line in FIG. 8. As another alternative, the second potential difference measuring step S285 may be performed in parallel with the post-leaving voltage measuring step S284, as indicated by a two-dotted dashed line in FIG. 8.

In a restraint first determining step S286, using the pre-leaving third voltage VB3$a$ and the post-leaving third voltage VB3$b$, it is determined whether or not the electrode body 30 of each restrained battery 10P has a positive-to-negative electrode short circuit. Specifically, this determination of the presence/absence of the positive-to-negative electrode short circuit is performed by comparing a drop rate, which is obtained by dividing a difference between the pre-leaving third voltage VB3$a$ and the post-leaving third voltage VB3$b$ by the restraint leaving period PH ((VB3$a$—VB3$b$)/PH)), with the threshold drop rate.

If NO in S286, i.e., if the drop rate is smaller than the threshold drop rate, that is, if the battery voltage VB slowly decreases, the restrained battery 10P under test is determined to have no positive-to-negative electrode short circuit. In contrast, if YES in S286, i.e., if the drop rate is larger than the threshold drop rate, the restrained battery 10P under test is determined to have a positive-to-negative electrode short circuit. In the restraint first determining step S286, each of the restrained batteries 10P included in the battery stack 1 is determined for the presence/absence of the positive-to-negative electrode short circuit. However, the restrained batteries 10P, which are restrained together to constitute the same unconnected battery stack 1M, are all subjected to a restraint second determining step S287, regardless of a determination result of each restrained battery 10P.

In the restraint second determining step S287, it is determined whether or not each restrained battery 10P under test is short-circuited between the case 11 and the negative electrode plate 32 based on the magnitude of the restraint first potential difference EP1, the magnitude of the restraint second potential difference EP2, and a restraint potential difference variation amount ΔP12 indicating a variation between these restraint potential differences (ΔP12=EP2−EP1). Specifically, it is determined, using the foregoing findings (see FIG. 3), whether or not the restrained battery 10P under test has a case-to-negative electrode short circuit. More specifically, the restrained batteries 10 corresponding to the above-described third and fourth patterns PT3 and PT4 are sorted out. In other words, a restrained battery(s) 10P in which both the restraint first potential difference EP1 and the restraint second potential difference EP2 are included within the lower limit range (a range of 0.4 V or less in the second embodiment, as in the first embodiment), i.e., EP1<0.4 V and EP2<0.4 V, or alternatively, a restrained battery(s) 10P in which the restraint first potential difference EP1 is smaller than the upper limit range (a range of 2.1 to 2.9 V in the second embodiment) and the restraint second potential difference EP2 is smaller than the restraint first potential difference EP1 (EP1>EP2), is determined to have a case-to-negative electrode short circuit (YES in S287), the process goes to a removing step S2A. In contrast, in the cases other than the above, the restrained battery 10P under test is determined to have no short circuit (NO in S287).

Therefore, when at least one of the restrained batteries 10P included in one unconnected battery stack 1M is determined to have a case-to-negative electrode short circuit (YES in S287), this unconnected battery stack 1M including the at least one short-circuited restrained battery 10P is shifted, as a whole, to the removing step S2A. At the same time, the unconnected battery stack 1M including at least one restrained battery 10P determined to have a positive-to-negative electrode short circuit (YES in S286) in the restraint first determining step S286 is also shifted to the removing step S2A via the restraint second determining step S287. In short, each unconnected battery stack 1M including at least one restrained battery 10P (i.e., defective battery 10N) having a positive-to-negative electrode short circuit (YES in S286) or having a case-to-negative electrode short circuit (YES in S287) is shifted to the removing step S2A. In contrast, when all of the restrained batteries 10P included in one unconnected battery stack 1M are determined to have no positive-to-negative electrode short circuit (NO in S286) and no case-to-negative electrode short circuit (NO in S287), this unconnected battery stack 1M is then shifted, as a whole, to a connecting step S29.

In the second embodiment, the restraint second determining step S287 is performed following the restraint first determining step S286. Contrary to this, however, the restraint second determining step S287 may be performed before the restraint first determining step S286, as indicated by a broken line in FIG. 8.

In the connecting step S29, the positive terminals 21 and the negative terminals 25 of a group of the restrained batteries 10P constituting one unconnected battery stack 1M (see FIG. 6) are connected with the bus bars 3 to interconnect the restrained batteries 10P, thus completing the battery stack 1 (see FIG. 5).

In the manufacturing method in the second embodiment, therefore, in manufacturing the battery stack 1, the restraining step S27 is performed to constitute the unconnected battery stack 1M and additionally the first potential difference measuring step S282 and the second potential difference measuring step S285 are performed for each of the restrained batteries 10P, which are included in the same unconnected battery stack 1M and more liable to be short-circuited between the case 11 and the negative electrode plate 32 due to being restrained, as compared to when unrestrained. Accordingly, the battery stack 1 can be manufactured with the restrained batteries 10P having been appropriately determined for whether or not each restrained battery 10P is short-circuited between the case 11 and the negative electrode plate 32. In the manufacturing method in the second embodiment, within the restraint short-circuit inspecting step S28, the first potential difference measuring step S282 and the second potential difference measuring step S285 are performed. This method can shorten the period required to manufacture the battery stack 1 as compared to when the first potential difference measuring step S282 and the second potential difference measuring step S285 are performed separately from the restraint short-circuit inspecting step S28.

In the manufacturing method for the battery stack 1 in the second embodiment, the restraint short-circuit inspecting step S28 includes the first potential difference measuring step S282 and the second potential difference measuring step S285 in addition to the pre-leaving voltage measuring step S281, restraint leaving step S283, post-leaving voltage measuring step S284, and restraint first determining step S286. Further, the first potential difference measuring step S282 is performed in parallel with, before, or after the pre-leaving voltage measuring step S281. The second potential difference measuring step S285 is performed in parallel with, before, or after the post-leaving voltage measuring step S284. The restraint standby period PWT overlaps the restraint leaving period PH. Therefore, this method can inspect the restrained batteries 10P by the restraint short-circuit inspecting step S28 for the self-discharging state, such as a positive-to-negative electrode short circuit, and additionally can manufacture the battery stack 1 with the restrained batteries 10P each reliably determined for whether or not each restrained battery 10P is short-circuited between the case 11 and the negative electrode plate 32 using the restraint first potential difference EP1 and the restraint second potential difference EP2 obtained in parallel with the above inspection.

In the removing step S2A, from the unconnected battery stack 1M including at least one defective battery 10N, that defective battery(s) 10N is removed. Specifically, the restraining bolts 52 and the nuts 53 of the restraining members 5 are loosened, and the defective battery(s) 10N is removed from the unconnected battery stack 1M and eliminated from a manufacturing process line.

In a re-restraining step S2B, subsequently, the unconnected battery stack 1M from which the defective battery(s) 10N has been removed is supplied with as many supplementary batteries 10H as the removed battery(s) 10N. Then, a group of the unremoved restrained batteries 10P and the supplementary battery(s) 10H is restrained again with the restraining members 5 to reconstitute the unconnected battery stack 1M (see FIG. 6). The supplementary battery 10H is a battery 10 prepared in advance for supplemental use, which was included in another unconnected battery stack 1M (i.e., a different one of the plural unconnected battery stacks 1M) and already determined to have no positive-to-negative electrode short circuit and no case-to-negative electrode short circuit in the restraint short-circuit inspecting step S28. Then, this reconstituted unconnected battery stack 1M is subjected again to the restraint short-circuit inspecting step S28 and repeatedly reconstituted by supplementing a supplementary battery(s) 10H until no defective battery 10N is generated. In the restraint second determining step S287, no defective battery 10N is included in the reconstituted unconnected battery stack 1M, this battery stack 1M is shifted to the connecting step S29 as in the above manner.

In the following connecting step S29, the bus bars 3 are connected to the positive terminals 21 and the negative terminals 25 of the grouped restrained batteries 10P of the reconstituted unconnected battery stack 1M to interconnect the restrained batteries 10P, completing the battery stack 1 (see FIG. 5). Thus, even when the unconnected battery stack 1M contains a short-circuited battery(s) 10, it is possible to easily reconstitute the unconnected battery stack 1M to manufacture the battery stack 1.

Figure 7:
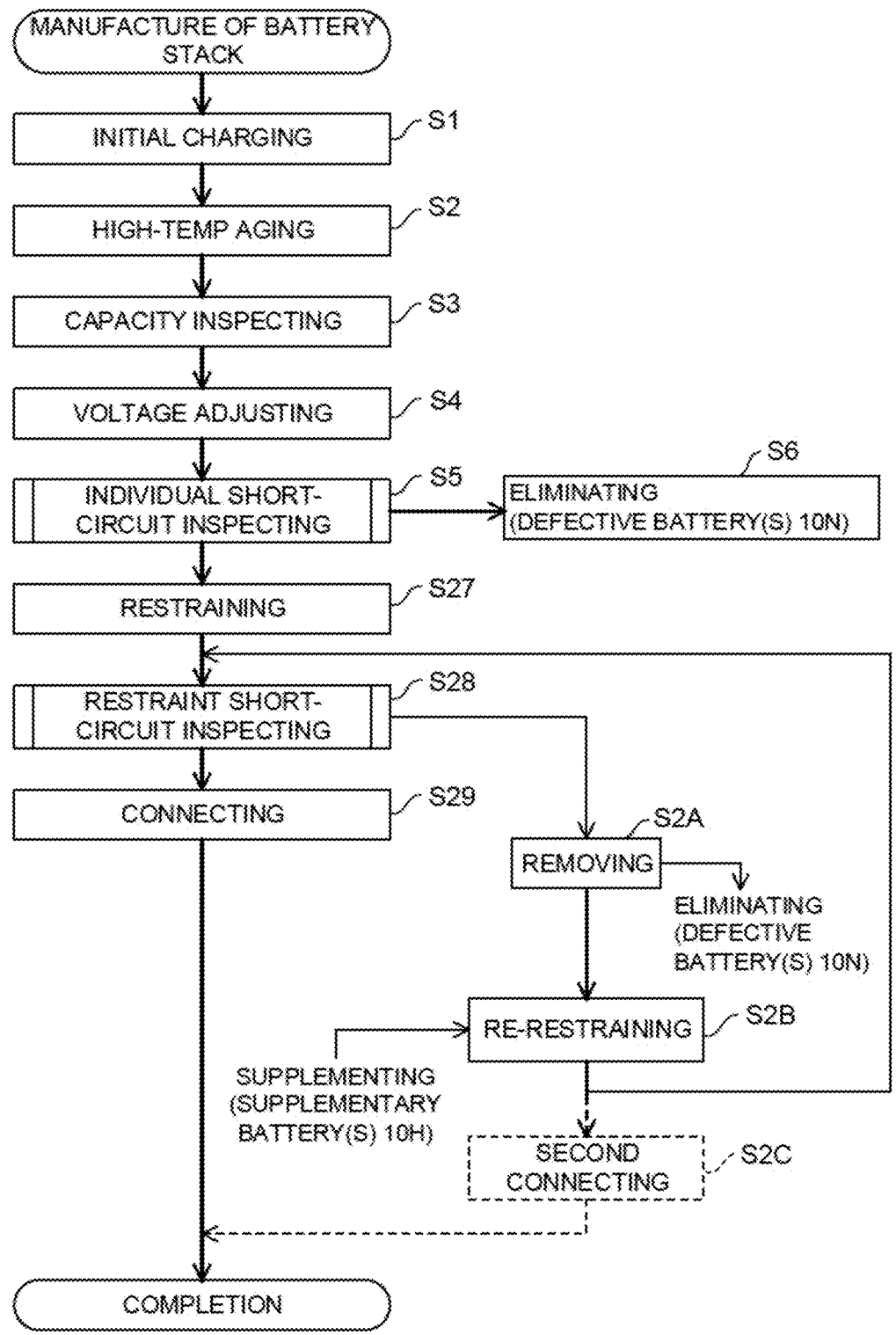
FIG. 7 is a flowchart showing a process of manufacturing a battery stack in the second embodiment.
Figure 8:
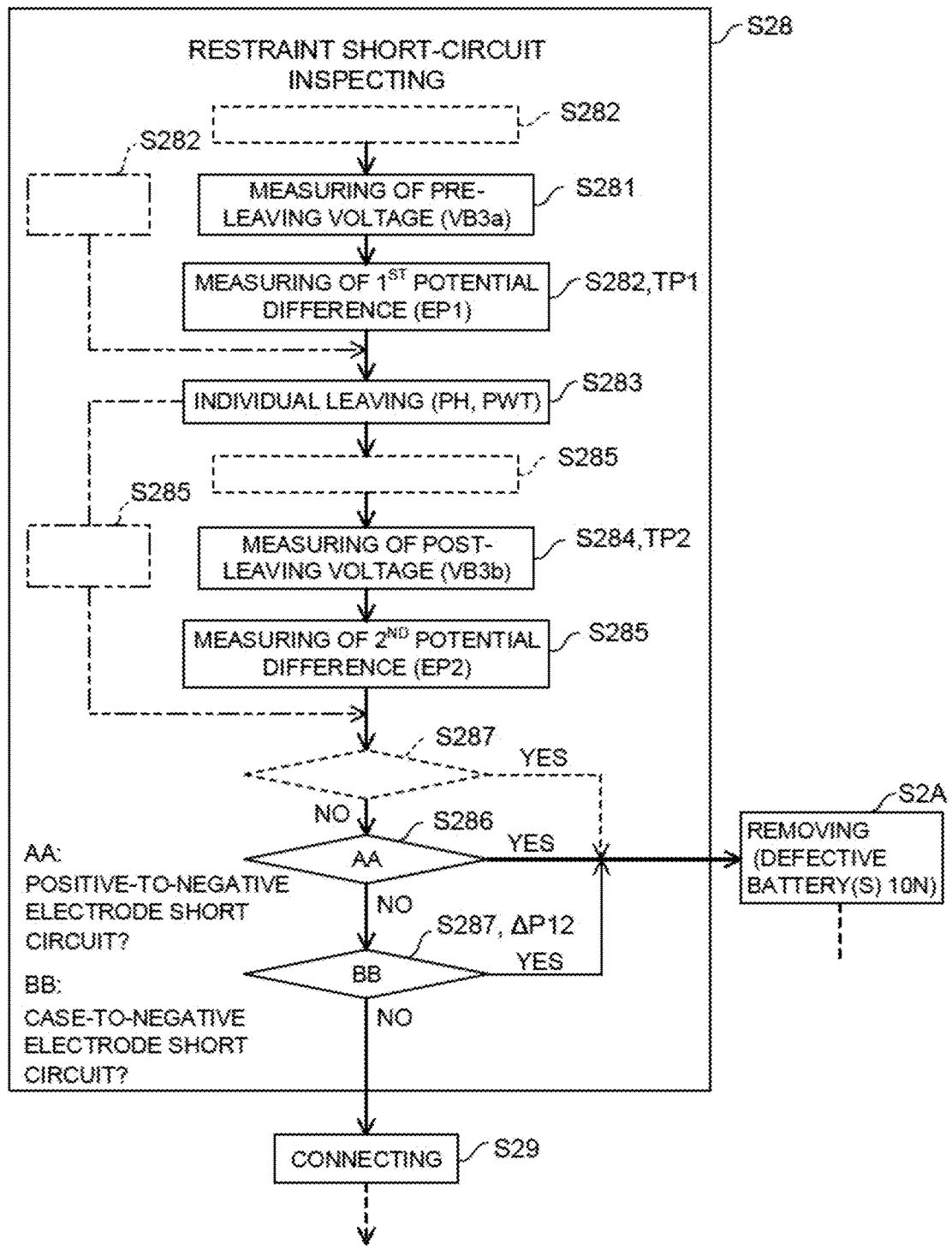
FIG. 8 is a flowchart showing the contents of a restraint short-circuit inspecting step of a process of manufacturing the battery stack in the second embodiment.

If there is a low probability that any more defective battery(s) 10N is generated in the unconnected battery stack 1M reconstituted by re-restraining the restrained batteries 10P in the re-restraining step S2B, a second connecting step S2C may be performed, as indicated by a broken line in FIG. 7, in which the bus bars 3 are connected to the positive terminals 21 and the negative terminals 25 of the restrained batteries 10P included in this reconstituted unconnected battery stack 1M to interconnect the restrained batteries 10P, completing the a battery stack 1 (see FIG. 7). This method can more easily reconstitute the unconnected battery stack 1M to manufacture a battery stack 1.

The foregoing first and second embodiments are mere examples and give no limitation to the present disclosure. The present disclosure may be embodied in other specific forms without departing from the essential characteristics thereof. For instance, in the battery stack 1 in the second embodiment, the restrained batteries 10P are electrically connected in series with each other through the bus bars 3. As an alternative, the battery stack may be arranged such that the restrained batteries 10P are electrically connected in parallel with each other.

In the second embodiment, in manufacturing the battery stack 1, the individual short-circuit inspecting step S5 includes the first potential difference measuring step S52, the second potential difference measuring step S55, and the individual second determining step S57 to inspect whether or not each battery 10 has a case-to-negative electrode short circuit. In addition, the restraint short-circuit inspecting step S28 includes the first potential difference measuring step S282, the second potential difference measuring step S285, and the restraint second determining step S287 to further inspect whether nor each restrained battery 10P of the unconnected battery stack 1M has a case-to-negative electrode short circuit.

However, in manufacturing the battery stack 1, the individual short-circuit inspecting step S5 of inspecting each battery 10 for a case-to-negative electrode short circuit may be omitted, so that only the restraint short-circuit inspecting step S28 is performed to determine whether or not each restrained battery 10P of the unconnected battery stack 1M has a case-to-negative electrode short circuit. This is because the restrained batteries 10P are more liable to cause a case-to-negative electrode short circuit due to being restrained in the stacking direction SH (i.e., the battery thickness direction CH) of the batteries 10, as compared to when not restrained.

REFERENCE SIGNS LIST

1 Battery stack (Device stack)
1M Unconnected battery stack (Unconnected device stack)
SH Stacking direction
5 Restraining member
10 Battery (Secondary battery, Power storage device)
10N Defective battery
10H Supplementary battery
10P Restrained battery (Restrained device)
11 Case (Metal case)
21 Positive terminal
25 Negative terminal (Negative potential member)
30 Electrode body
31 Positive electrode plate
TH Positive-electrode-plate thickness direction
THO Outside (in positive-electrode-plate thickness direction)
32 Negative electrode plate
50 Insulation film
VB Battery voltage
VB1 First voltage (First device voltage)
VB2a Pre-leaving second voltage (Pre-leaving device voltage)
VB2b Post-leaving second voltage (Post-leaving device voltage)
VB3a Pre-leaving third voltage (Restraint pre-leaving device voltage)
VB3b, Post-leaving third voltage (Restraint post-leaving device voltage)
PP Positive potential
PN Negative potential
PC Case potential
EF Potential difference (Case-to-negative electrode potential difference)
EF1 First potential difference (Case-to-negative electrode potential difference)
EF2 Second potential difference (Case-to-negative electrode potential difference)
ΔF12 Potential difference variation amount (Variation between first potential difference and second potential difference)
EP Restraint potential difference (Case-to-negative electrode potential difference)
EP1 Restraint first potential difference (First potential difference, Ca se-to-negative electrode short circuit)
EP2 Restraint second potential difference (Second potential difference, Case-to-negative electrode short circuit)
ΔP12 Restraint potential difference variation amount (Variation between restraint first potential difference and restraint second potential difference)
PT1 to PT4 Pattern
Tc Adjustment completion time
KT Elapsed time
TF1 First time (First potential difference measuring time)
TF2 Second time (Second potential difference measuring time)
TP1 Restraint first time (First potential difference measuring time)
TP2 Restraint second time (Second potential difference measuring time)
S1 Initial charging step
S4 Voltage adjusting step
S5 Individual short-circuit inspecting step (Self-discharge inspecting step)
S51 Pre-leaving voltage measuring step
S52, S282 First potential difference measuring step (First measuring step)
S53 Individual leaving step (Leaving step)
IH Individual leaving period (Leaving period)
IWT Individual standby period (Standby period)

S54 Post-leaving voltage measuring step
S55, S285 Second potential difference measuring step (Second measuring step)
S56 Individual first determining step (Self-discharge checking step)
S57 Individual second determining step (Case-to-negative electrode short-circuit determining step)
S6 Battery eliminating step (Eliminating step)
S27 Restraining step
S28 Restraint short-circuit inspecting step (In-stack self-discharge inspecting step)
S281 Pre-leaving voltage measuring step (Restraint pre-leaving voltage measuring step)
S283 Restraint leaving step
S284 Post-leaving voltage measuring step (Restraint post-leaving voltage measuring step)
PH Restraint leaving period (Leaving period)
PWT Restraint standby period (Standby period)
S286 Restraint first determining step (Restraint self-discharge checking step)
S287 Restraint second determining step (Case-to-negative electrode short-circuit determining step)

What is claimed is:

1. A method for inspecting a power storage device comprising a metal case, an electrode body including a positive electrode plate and a negative electrode plate located outside the positive electrode plate in a thickness direction of the positive electrode plate, and an insulation film covering the electrode body to insulate the electrode body from the metal case, the method comprising:
    adjusting the power storage device to a first device voltage by charging or discharging the power storage device;
    measuring a first potential difference at a first potential difference measuring time after adjusting the power storage device to the first device voltage, the first potential difference being a case-to-negative electrode potential difference generated between the metal case and a negative-electrode potential member that is exposed outside the metal case and is electrically connected to the negative electrode plate to have a negative-electrode potential;
    measuring a second potential difference, which is the case-to-negative electrode potential difference, at a second potential difference measuring time after a lapse of a standby period of 24 hours or more from the first potential difference measuring time; and
    determining whether or not a case-to-negative electrode short circuit exists between the metal case and the negative electrode plate based on a magnitude of the first potential difference, a magnitude of the second potential difference, and a variation between the first potential difference and the second potential difference.

2. A method for manufacturing a power storage device, comprising the method for inspecting a power storage device according to claim 1,
    wherein adjusting the power storage device to the first device voltage is to adjust the power storage device to the first device voltage by charging or discharging the power storage device that has undergone initial charge and subsequent charge and discharge, and
    measuring the first potential difference, measuring the second potential difference, and determining the case-to-negative electrode short circuit are performed on the power storage device in an individual state.

3. The method for manufacturing a power storage device according to claim 2, further comprising inspecting a self-discharging state of the power storage device after adjusting the power storage device to the first device voltage,
    wherein measuring the first potential difference and measuring the second potential difference are performed within inspecting the self-discharging state.

4. The method for manufacturing a power storage device according to claim 3, wherein
    inspecting the self-discharging state includes:
        measuring a pre-leaving device voltage of the power storage device after adjusting the power storage device to the first device voltage;
        leaving the power storage device, for which the pre-leaving device voltage has been measured, for a leaving period with terminals in an open state;
        measuring a post-leaving device voltage of the power storage device after leaving the power storage device;
        checking a self-discharging state of the power storage device using the pre-leaving device voltage and the post-leaving device voltage of the power storage device;
        after adjusting the power storage device to the first device voltage but before leaving the power storage device, measuring the first potential difference to be performed in parallel with, before, or after measuring the pre-leaving device voltage; and
        after leaving the power storage device but before checking the self-discharging state, measuring the second potential difference to be performed in parallel with, before, or after measuring the post-leaving device voltage, and
    the standby period overlaps the leaving period.

5. A method for manufacturing a device stack in which a plurality of the power storage devices are stacked while being insulated from each other, and restrained in a stacking direction by a restraining member, forming a plurality of restrained devices, and the restrained devices are connected with each other,
    the method comprising:
    restraining the power storage devices while insulating them from each other, using the restraining member, to constitute an unconnected device stack including the restrained devices that are unconnected with each other, and
    wherein the method includes the method for inspecting a power storage device according to claim 1, wherein
    adjusting the power storage device to the first device voltage is to adjust the power storage devices to the first device voltage by charging or discharging the power storage devices that have undergone initial charge and subsequent charge and discharge, before restraining the power storage devices, and
    measuring the first potential difference, measuring the second potential difference, and determining the case-to-negative electrode short circuit are performed on each of the restrained devices that constitute the unconnected device stack, after restraining the power storage devices.

6. The method for manufacturing a device stack according to claim 5, further comprising inspecting an in-stack self-discharging state of each of the restrained devices that constitute the unconnected device stack,
    wherein measuring the first potential difference and measuring the second potential difference are performed within inspecting the in-stack self-discharging state.

7. The method for manufacturing a device stack according to claim 6, wherein inspecting the in-stack self-discharging state includes:
    measuring a restraint pre-leaving device voltage of each of the restrained devices after restraining the power storage devices;
    leaving the restrained devices, for each of which the restraint pre-leaving device voltage has been measured, for a restraint leaving period with terminals in an open state;
    measuring a restraint post-leaving device voltage of each of the restrained devices after leaving the restrained devices;
    checking a restraint self-discharging state of each of the restrained devices using the restraint pre-leaving device voltage and the restraint post-leaving device voltage of the corresponding restrained device;
    after restraining the storage devices but before leaving the restrained devices, measuring the first potential difference to be performed in parallel with, before, or after measuring the restraint pre-leaving device voltage; and
    after leaving the restrained devices but before checking the restraint self-discharging state, measuring the second potential difference to be performed in parallel with, before, or after measuring the restraint post-leaving device voltage, and
the standby period overlaps the restraint leaving period.

* * * * *